(12) United States Patent
Nozawa et al.

(10) Patent No.: US 9,017,902 B2
(45) Date of Patent: Apr. 28, 2015

(54) MASK BLANK, TRANSFER MASK, AND METHOD OF MANUFACTURING A TRANSFER MASK

(75) Inventors: Osamu Nozawa, Shinjku-ku (JP); Hiroyuki Iwashita, Shinjuku-ku (JP); Masahiro Hashimoto, Shinjuku-ku (JP); Atsushi Kominato, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 342 days.

(21) Appl. No.: 13/378,739

(22) PCT Filed: Jun. 17, 2010

(86) PCT No.: PCT/JP2010/060269
§ 371 (c)(1),
(2), (4) Date: Dec. 16, 2011

(87) PCT Pub. No.: WO2010/147172
PCT Pub. Date: Dec. 23, 2010

(65) Prior Publication Data
US 2012/0100470 A1    Apr. 26, 2012

(30) Foreign Application Priority Data
Jun. 18, 2009    (JP) .................... 2009-145700

(51) Int. Cl.
*G03F 1/50* (2012.01)
*G03F 1/58* (2012.01)
*G03F 1/80* (2012.01)

(52) U.S. Cl.
CPC .. *G03F 1/50* (2013.01); *G03F 1/58* (2013.01); *G03F 1/80* (2013.01)

(58) Field of Classification Search
CPC ......................................................... G03F 1/50
USPC ......................................................... 430/4–5
See application file for complete search history.

(56) References Cited

U.S. PATENT DOCUMENTS

| 6,753,538 B2 | 6/2004 | Musil et al. |
| 2001/0027917 A1* | 10/2001 | Ferranti et al. ........... 204/192.11 |
| 2007/0212618 A1 | 9/2007 | Yoshikawa et al. |
| 2007/0212619 A1 | 9/2007 | Yoshikawa et al. |
| 2007/0248897 A1 | 10/2007 | Yoshikawa et al. |
| 2009/0246647 A1 | 10/2009 | Hashimoto et al. |
| 2010/0112464 A1* | 5/2010 | Kanamitsu ........................ 430/5 |

FOREIGN PATENT DOCUMENTS

| JP | 2000-010260 A | 1/2000 |
| JP | 2004273933 A | 9/2004 |
| JP | 2004-537758 A | 12/2004 |
| JP | 2007-241060 A | 9/2007 |
| JP | 2007-241065 A | 9/2007 |
| JP | 2007-241137 A | 9/2007 |
| JP | 2007-292824 A | 11/2007 |
| JP | 2009-244752 A | 1/2009 |
| JP | 2009-086389 A | 4/2009 |
| JP | 2010-009001 A | 1/2010 |

OTHER PUBLICATIONS

Office Action issued in corresponding Japanese Patent Application No. 2011-225682 dated Sep. 24, 2013.

* cited by examiner

*Primary Examiner* — Christopher Young
(74) *Attorney, Agent, or Firm* — Sughrue Mion, PLLC

(57) ABSTRACT

Provided is a mask blank which enables EB defect correction to be suitably applied and which further enables a reduction in the thickness of a light-shielding film. A mask blank 10 is used for producing a transfer mask adapted to be applied with ArF exposure light and has a light-shielding film 2 on a transparent substrate 1. The light-shielding film 2 has an at least two-layer structure comprising a lower layer composed mainly of a material containing a transition metal, silicon, and at least one or more elements selected from oxygen and nitrogen and an upper layer composed mainly of a material containing a transition metal, silicon, and at least one or more elements selected from oxygen and nitrogen. The ratio of the etching rate of the lower layer to that of the upper layer is 1.0 or more and 20.0 or less in etching which is carried out by supplying a fluorine-containing substance to a target portion and irradiating charged particles to the target portion.

14 Claims, 4 Drawing Sheets

MASK BLANK, TRANSFER MASK, AND METHOD OF MANUFACTURING A TRANSFER MASK

CROSS REFERENCE TO RELATED APPLICATIONS

This application is a National Stage of International Application No. PCT/JP2010/060269 filed Jun. 17, 2010, claiming priority based on Japanese Patent Application No. 2009-145700 filed Jun. 18, 2009 the contents of all of which are incorporated herein by reference in their entirety.

TECHNICAL FIELD

This invention relates to a mask blank, a transfer mask, and a method of manufacturing a transfer mask. In particular, this invention relates to a mask blank for manufacturing a transfer mask to which a defect correction technique using charged particle irradiation can be suitably applied, and to a method of manufacturing such a transfer mask.

BACKGROUND ART

Generally, fine pattern formation is carried out by the photolithography in manufacturing processes of a semiconductor device. A number of substrates called transfer masks (photomasks) are normally used for this fine pattern formation. The transfer mask comprises generally a transparent glass substrate having thereon a fine pattern made of a metal thin film or the like. The photolithography is used also in the manufacture of the transfer mask.

In the manufacture of a transfer mask by the photolithography, use is made of a mask blank having a thin film (e.g. a light-shielding film or the like) for forming a transfer pattern (mask pattern) on a transparent substrate such as a glass substrate. The manufacture of the transfer mask using the mask blank comprises an exposure process of applying required pattern writing to a resist film formed on the mask blank, a developing process of developing the resist film according to the required pattern writing to form a resist pattern, an etching process of etching the thin film according to the resist pattern, and a process of stripping and removing the remaining resist pattern. In the developing process, a developer is supplied after applying the required pattern writing to the resist film formed on the mask blank to dissolve a portion of the resist film soluble in the developer, thereby forming the resist pattern. In the etching process, using this resist pattern as a mask, an exposed portion of the thin film, where the resist pattern is not formed, is dissolved by dry etching or wet etching, thereby forming a required mask pattern on the transparent substrate. In this manner, the transfer mask is produced.

For miniaturization of a pattern of a semiconductor device, it is necessary to shorten the wavelength of an exposure light source for use in the photolithography in addition to the miniaturization of the mask pattern formed in the transfer mask. In recent years, the wavelength of an exposure light source in the manufacture of a semiconductor device has been shortened from a KrF excimer laser (wavelength 248 nm) to an ArF excimer laser (wavelength 193 nm).

As a type of transfer mask, apart from a conventional binary mask having a light-shielding film pattern made of a chromium-based material on a transparent substrate, there has appeared in recent years a binary mask or the like using, as a light-shielding film, a material such as MoSiN containing a transition metal and silicon as main metal components and further containing nitrogen, as described in Patent Document 1.

In the meantime, hitherto, with respect to a transfer mask manufactured from a mask blank by forming a transfer pattern in a light-shielding film by dry etching using as a mask a resist pattern formed in a resist film by electron beam writing and development or an etching mask pattern formed in an etching mask film, a comparison is made, using a pattern inspection apparatus, between a design transfer pattern and the transfer pattern formed in the light-shielding film and a defect (so-called black defect) portion where the light-shielding film remains in excess as compared with the design transfer pattern is corrected by a physical treatment using nano-machining or focused ion beam FIB (Focused Ion Beam). However, there has been a problem that the black defect correction by such a physical treatment takes much time. Further, since the irradiation dose of Ga ions becomes large in the normal FIB treatment, Ga stain remaining on a QZ substrate has been a problem. In view of this, there has been reported a technique of gas assist or the like for enhancing the reactivity to suppress the Ga irradiation dose (see Patent Document 2).

On the other hand, Patent Document 3 discloses a defect correction technique that supplies a xenon difluoride ($XeF_2$) gas to a black defect portion of a light-shielding film and further irradiates an electron beam onto the black defect portion, thereby etching the black defect portion to remove it (hereinafter, such defect correction that is carried out by irradiating charged particles such as an electron beam will be referred to simply as EB defect correction). Such EB defect correction was at first used for correction of a black defect portion in an absorber film of a reflective mask for EUV lithography, but has started to be used also for defect correction of a MoSi-based halftone mask.

PRIOR ART DOCUMENT

Patent Document

Patent Document 1: JP-A-2007-292824
Patent Document 2: JP-A-2000-10260
Patent Document 3: JP-A-2004-537758

SUMMARY OF THE INVENTION

Problem to be Solved by the Invention

Using a binary mask blank formed with a light-shielding film of a laminated structure made of materials each containing a transition metal and silicon as main metal components and further containing nitrogen as disclosed in Patent Document 1, the present inventors produced a transfer mask formed with a transfer pattern in the light-shielding film, performed a defect inspection of the produced transfer mask, and performed EB defect correction of a black defect portion as disclosed in Patent Document 3, i.e. performed etching of the black defect portion by supplying a $XeF_2$ gas to the black defect portion and irradiating charged particles such as electrons onto the black defect portion. As a result, it has been found that the following problems may occur depending on the relationship between the film compositions in upper and lower layers of the laminated structure.

Generally, in order to suppress the surface reflection of a light-shielding film, the surface reflectance of the light-shielding film is reduced by setting the degree of oxidation or nitridation of a material of a layer on the surface side (upper layer) to be higher than that of a material of a layer on the substrate side (lower layer). On the other hand, in a binary mask blank, a light-shielding film is required to have a predetermined or higher light-shielding performance (e.g. an optical density (OD) of 2.8 or more). As the degree of oxidation or nitridation of a material increases, the light-shielding performance tends to decrease. In the meantime, due to the miniaturization of a transfer pattern in recent years, it has become necessary to use an oblique illumination method or an immersion exposure method. However, this has caused a problem of the influence of the shadowing effect (shadowing) and, in order to reduce this influence, a reduction in the thickness of the light-shielding film has become necessary. Therefore, it is necessary to minimize the degree of oxidation or nitridation in the layer on the substrate side (lower layer) in order to ensure the light-shielding performance with as small a thickness as possible. On the other hand, the surface reflectance on the substrate side (back-surface reflectance) of the light-shielding film should also be suppressed to a predetermined value or less although not so low as the surface reflectance on the surface side (front-surface reflectance) of the light-shielding film, and thus, the lower layer of the light-shielding film should also be oxidized or nitrided to some extent.

The $XeF_2$ gas is known as an isotropic etching gas for silicon and its mechanism is such that etching proceeds in processes of surface adsorption, separation into Xe and F, and production and volatilization of a high-order fluoride of silicon. However, in the case of nitrided, oxidized, or carbonized silicon such as $Si_3N_4$, $SiO_2$, SiON, or SiC, a highly volatile high-order fluoride is not easily formed so that there is a tendency of having high etching resistance to a fluorine-based gas such as a $XeF_2$ gas. In EB defect correction, the $XeF_2$ gas etching rate is significantly improved by carrying out irradiation of charged particles such as an electron beam so that selective anisotropic etching of a black defect portion is enabled. However, even in this case, as the ratio of nitrided, oxidized, or carbonized silicon in the light-shielding film increases, the etching rate tends to be lowered. Since, as described above, the upper layer is made of the material with high degree of oxidation or nitridation in order to reduce the front-surface reflectance, the etching rate difference between the upper and lower layers becomes large so that a level difference occurs. In an extreme case, a large undercut is formed.

According to the recent EB defect correction technique, using a passivation technique (supplying water, oxide-based gas, or the like) such as water passivation that lowers the etching rate by supplying water, it is possible to reduce the disadvantage even if there is some etching rate difference between the upper and lower layers of the light-shielding film. However, there is a limit to such etching rate control. Further, if the etching rate is excessively lowered, the correction time is prolonged so that there is no merit over the conventional defect correction by the physical treatment. Accordingly, the laminated structure of the light-shielding film that requires the etching rate of the lower layer to be extremely lowered is not preferable.

Therefore, this invention has been made in order to solve the conventional problems and has an object to provide a mask blank and a transfer mask, which enable EB defect correction to be suitably applied and which further enable a reduction in the thickness of a light-shielding film, and to provide a method of manufacturing such a transfer mask.

Means for Solving the Problem

The present inventors have made an intensive study on the problems which arise when the EB defect correction is applied for correction of the black defect portion with respect to the transfer mask which is formed with the transfer pattern in the light-shielding film using the conventional binary mask blank having the light-shielding film of the laminated structure made of the materials each containing the transition metal and silicon as the main metal components and further containing nitrogen.

As a result of studying various materials, the present inventors have found that, in a mask blank comprising a light-shielding film having an at least two-layer structure comprising a lower layer composed mainly of a material containing a transition metal, silicon, and at least one or more elements selected from oxygen and nitrogen and an upper layer composed mainly of a material containing a transition metal, silicon, and at least one or more elements selected from oxygen and nitrogen, it is possible to solve the problems which arise when the conventional EB defect correction is applied, and further to achieve a reduction in the thickness of the light-shielding film by adjusting, in a predetermined range, the relationship between the etching rate of the upper layer and that of the lower layer in the EB defect correction.

As a result of further continuing intensive studies based on the elucidated fact and consideration described above, the present inventors have completed this invention.

Specifically, in order to solve the above-mentioned problems, this invention has the following structures.

(Structure 1)

A mask blank adapted to manufacture a transfer mask applied with ArF excimer laser exposure light, comprising:

a transparent substrate; and a light-shielding film formed on the transparent substrate film, the light-shielding film serving to form a transfer pattern;

wherein the light-shielding film has an at least two-layer structure comprising a lower layer composed mainly of a material containing a transition metal, silicon, and at least one or more elements selected from oxygen and nitrogen and an upper layer composed mainly of a material containing a transition metal, silicon, and at least one or more elements selected from oxygen and nitrogen, and wherein a ratio of an etching rate of the lower layer to an etching rate of the upper layer is 1.0 or more and 20.0 or less in etching which is carried out by supplying a fluorine-containing substance to a target portion and irradiating charged particles to the target portion.

(Structure 2)

The mask blank according to structure 1, wherein a total content of the nitrogen and the oxygen in the lower layer is 10 at % or more.

(Structure 3)

The mask blank according to structure 1 or 2, wherein a total content of the nitrogen and the oxygen in the upper layer is 30 at % or more.

(Structure 4)

The mask blank according to any one of structures 1 to 3, wherein a content of the transition metal in the upper layer is 10 at % or less.

(Structure 5)

The mask blank according to any one of structures 1 to 4, wherein a total content of the nitrogen and the oxygen in the lower layer is 35 at % or less.

(Structure 6)

The mask blank according to structure 5, wherein a ratio obtained by dividing a content of the transition metal in the lower layer by a total content of the transition metal and the silicon in the lower layer is 14% or more and 35% or less.

(Structure 7)

The mask blank according to any one of structures 1 to 4, wherein a total content of the nitrogen and the oxygen in the lower layer is 30 at % or less.

(Structure 8)

The mask blank according to structure 7, wherein a ratio obtained by dividing a content of the transition metal in the lower layer by a total content of the transition metal and the silicon in the lower layer is 14% or more and 40% or less.

(Structure 9)

The mask blank according to any one of structures 1 to 8, wherein the light-shielding film has a thickness of less than 65 nm.

(Structure 10)

The mask blank according to any one of structures 1 to 9, wherein the upper layer has a thickness of 5 nm or more and 20 nm or less.

(Structure 11)

The mask blank according to any one of structures 1 to 10, wherein an etching mask film is provided on an upper surface of the light-shielding film and contains chromium and at least one of nitrogen and oxygen, a content of the chromium in the etching mask film is less than 50 at %, and a thickness of the etching mask film is 5 nm or more and 20 nm or less.

(Structure 12)

A transfer mask manufactured using the mask blank according to any one of structures 1 to 11.

(Structure 13)

A transfer mask adapted to be applied with ArF excimer laser exposure light, comprising:

a transparent substrate; and a light-shielding film formed on the transparent substrate, the light-shielding film having a transfer pattern;

wherein the light-shielding film has an at least two-layer structure comprising a lower layer composed mainly of a material containing a transition metal, silicon, and at least one or more elements selected from oxygen and nitrogen and an upper layer composed mainly of a material containing a transition metal, silicon, and at least one or more elements selected from oxygen and nitrogen, and wherein a ratio of an etching rate of the lower layer to an etching rate of the upper layer is 1.0 or more and 20.0 or less in etching which is carried out by supplying a fluorine-containing substance to a target portion and irradiating charged particles to the target portion.

(Structure 14)

A method of manufacturing a transfer mask using the mask blank according to any one of structures 1 to 11, comprising:

a defect correction step of making a comparison between a design transfer pattern and the transfer pattern formed in the light-shielding film and etching a defect portion, where the light-shielding film remains, by supplying a fluorine-containing substance to the defect portion and irradiating charged particles to the defect portion, wherein the defect correction step supplies water or an oxide-based fluid upon etching the lower layer of the light-shielding film so as to reduce the etching rate of the lower layer.

Effect of the Invention

According to this invention, by forming a light-shielding film into an at least two-layer structure comprising a lower layer composed mainly of a material containing a transition metal, silicon, and at least one or more elements selected from oxygen and nitrogen and an upper layer composed mainly of a material containing a transition metal, silicon, and at least one or more elements selected from oxygen and nitrogen and by adjusting, in a predetermined range, the relationship between the etching rate of the upper layer and that of the lower layer in EB defect correction, it is possible to provide a mask blank and a transfer mask, which can solve the problems that arise when the conventional EB defect correction is applied, and which, as a result, enable the EB defect correction to be suitably applied to black defect correction of a transfer pattern, and to provide a method of manufacturing such a transfer mask.

Further, according to this invention, it is possible to provide a mask blank and a transfer mask, which can achieve an optical density of a light-shielding film, required for a binary mask, with a thickness of, for example, less than 65 nm and thus can solve the problem due to shadowing, and further to provide a method of manufacturing such a transfer mask.

MODE FOR CARRYING OUT THE INVENTION

Hereinbelow, an embodiment of this invention will be described in detail with reference to the drawings.

This invention is a mask blank for use in the manufacture of a transfer mask adapted to be applied with ArF exposure light, the mask blank comprising, on a transparent substrate, a light-shielding film for forming a transfer pattern, wherein the light-shielding film has an at least two-layer structure comprising a lower layer composed mainly of a material containing a transition metal, silicon, and at least one or more elements selected from oxygen and nitrogen and an upper layer composed mainly of a material containing a transition metal, silicon, and at least one or more elements selected from oxygen and nitrogen and wherein the ratio of the etching rate of the lower layer to that of the upper layer is 1.0 or more and 20.0 or less in etching which is carried out by supplying a fluorine-containing substance to a target portion and irradiating charged particles to the target portion.

Figures 1, 2:
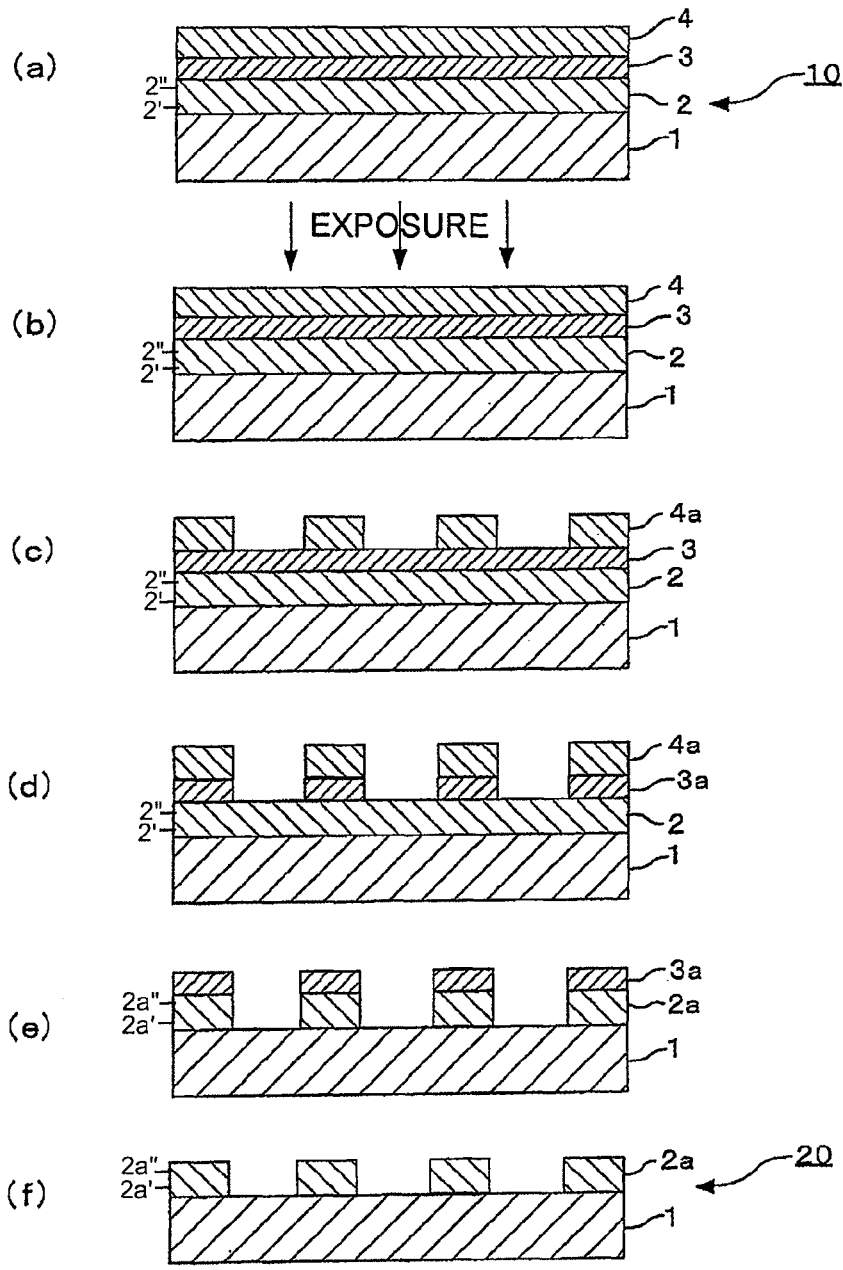
FIG. 1 is a cross-sectional view of an embodiment of a mask blank according to this invention.
FIG. 2 is cross-sectional views showing processes of manufacturing a transfer mask using the embodiment of the mask blank according to this invention.

FIG. 1 is a cross-sectional view of a mask blank according to this invention. As shown in FIG. 1, a mask blank 10 according to the embodiment of this invention comprises a light-shielding film 2 on a transparent substrate 1. The transparent substrate 1 is not particularly limited as long as it has transparency for ArF excimer laser. In this invention, a synthetic quartz substrate and various other glass substrates can be used. Among them, the synthetic quartz substrate is particularly suitable for this invention because it has high transparency for ArF excimer laser.

The light-shielding film 2 has an at least two-layer structure comprising a lower layer composed mainly of a material containing a transition metal, silicon, and at least one or more elements selected from oxygen and nitrogen and an upper layer composed mainly of a material containing a transition metal, silicon, and at least one or more elements selected from oxygen and nitrogen and the ratio of the etching rate of the lower layer to that of the upper layer (lower layer etching rate/upper layer etching rate) should be set to 1.0 or more in etching which is carried out by supplying a fluorine-containing substance (unexcited state) to a target portion and, in addition, by irradiating charged particles such as an electron beam to the target portion to improve the etching rate by the fluorine-containing substance, i.e. in EB defect correction. If this ratio is less than 1.0, there is a possibility that an edge portion of a transfer pattern of the upper layer is etched while etching the lower layer, thus degrading the line edge roughness. Further, there occurs a disadvantage such as a change in the optical properties of the upper layer (an increase in front-surface reflectance for exposure light, or the like) due to the proceeding of etching from a surface of the upper layer to cause a film loss or the like. Taking into account maintaining a better edge shape of the upper layer, it is more preferable that the ratio of the etching rate of the lower layer to that of the upper layer be 1.5 or more in the EB defect correction. Further, in this invention, the ratio of the etching rate of the lower layer to that of the upper layer should also be 20.0 or less.

As the fluorine-containing substance which is supplied to the target portion (black defect portion) in the EB defect correction, use can be made of $XeF_2$, $XeF_4$, $XeF_6$, $XeOF_2$, $XeOF_4$, $XeO_2F_2$, $XeO_3F_2$, $XeO_2F_4$, $ClF_3$, $ClF$, $BrF_5$, $BrF$, $IF_3$, $IF_5$, $KrF$, $ArF$, or the like. In particular, $XeF_2$ is optimal. Such a substance is preferably supplied in a gaseous state to the target portion.

If there is a possibility that an undercut is formed due to the etching rate of the lower layer being greater than that of the upper layer in the EB defect correction, when etching the lower layer, use is made of the passivation technique, apart from a means of reducing the supply amount of the fluorine-based gas ($XeF_2$ gas or the like), that lowers the etching rate of the lower layer by supplying an adequate amount of water or oxide-based gas to the target portion to be removed. Oxidation is promoted at the portion where the water or the oxide-based gas is supplied, so that the side wall of the lower layer is formed with an oxide film. Since the etching rate of the EB defect correction is lowered with respect to the oxide film, it is possible to reduce the etching rate (particularly the etching rate in a lateral direction) of the lower layer. However, with the passivation technique, the range where the etching rate can be lowered is limited. Further, since the etching rate of the lower layer is reduced relative to that of the upper layer, there is a case where the defect correction takes much time to degrade the manufacturing throughput so that the merit over the correction by the physical treatment cannot be obtained. Further, if the water is excessively supplied, there is a possibility that hydrogen after separation of oxygen from the water is bonded to fluorine separated from the fluorine-based gas such as the $XeF_2$ gas to form hydrofluoric acid, thereby dissolving the upper layer or the substrate. Taking these into account, the ratio of the etching rate of the lower layer to that of the upper layer should be set to 20.0 or less. Taking into account the matters including further suppression of the change in the optical properties of the upper layer before and after the EB defect correction, the ratio of the etching rate of the lower layer to that of the upper layer is preferably 15.0 or less in the EB defect correction. Further, in order to further improve the manufacturing throughput, the ratio of the etching rate of the lower layer to that of the upper layer is more preferably 10.0 or less in the EB defect correction.

By forming the light-shielding film 2 into the at least two-layer structure comprising the lower layer composed mainly of the material containing the transition metal, silicon, and at least one or more elements selected from oxygen and nitrogen and the upper layer composed mainly of the material containing the transition metal, silicon, and at least one or more elements selected from oxygen and nitrogen, the relationship between the etching rate of the upper layer and that of the lower layer in the EB defect correction can be properly adjusted as described above.

In a thin film containing a transition metal and silicon, the tendencies of the change in etching rate with respect to the content of oxygen or nitrogen in the thin film differ between the case of etching for EB defect correction and the case of etching by a fluorine-based gas in a plasma state, i.e. normal dry etching. In the case of the EB defect correction, as the oxygen or nitrogen content in the thin film increases, i.e. as the presence of silicon oxide or nitride in the thin film increases, the etching rate tends to be lowered. On the other hand, in the case of the normal dry etching by the fluorine-based gas plasma, even if the oxygen or nitrogen content in the thin film increases, the etching rate does not substantially change or the etching rate tends to increase depending on the transition metal content. Therefore, the tendency of the etching rate in the case of the dry etching by the fluorine-based gas in the excited state (plasma state) for the thin film containing the transition metal and silicon hardly serves as reference for adjusting the etching rate in the EB defect correction which irradiates charged particles while supplying a fluorine-based gas in an unexcited state.

While the upper layer (front-surface antireflection layer) of the light-shielding film 2 is composed mainly of the material containing the transition metal, silicon, and at least one or more elements selected from oxygen and nitrogen, the total content of nitrogen and oxygen in the upper layer is preferably 30 at % or more in order to set the front-surface reflectance of the light-shielding film 2 to a predetermined value (e.g. 30%) or less. In terms of reducing the thickness of the entire light-shielding film, the total content of nitrogen and oxygen in the upper layer is preferably 60 at % or less.

In the case of oxygen, the degree of reduction in the extinction coefficient relative to its content in the layer is greater as compared with nitrogen and thus the transmittance of the upper layer for exposure light can be more enhanced so that it is possible to more reduce the front-surface reflectance. The oxygen content in the upper layer is preferably 10 at % or more and more preferably 15 at % or more. On the other hand, the nitrogen content in the upper layer is preferably 10 at % or more, but in order to reduce the front-surface reflectance while somewhat suppressing the oxygen content in the upper layer for the purpose of reducing the thickness of the light-shielding film, the nitrogen content is preferably 15 at % or more and more preferably 20 at % or more.

As the transition metal contained in the material of the upper layer, use can be made of molybdenum, tantalum, tungsten, titanium, chromium, hafnium, nickel, vanadium, zirconium, ruthenium, rhodium, niobium, palladium, or the like. Among them, molybdenum is preferable. The transition metal content in the upper layer is preferably 10 at % or less. If the transition metal content in the upper layer is greater than 10 at %, when a transfer mask is manufactured from this mask blank, the resistance to mask cleaning (alkaline cleaning with an ammonia hydrogen peroxide mixture, or hot water cleaning) is low so that there is a possibility of the occurrence of a change in optical properties (an increase in front-surface reflectance) due to dissolution of the upper layer or a degradation in line edge roughness or CD accuracy due to a change in the shape of a transfer pattern edge portion. This tendency is particularly significant when molybdenum is used as the transition metal in the upper layer. In particular, in the case where molybdenum is used as the transition metal in the upper layer, when a heat treatment (annealing) is carried out at a high temperature for the stress control of the light-shielding film, if the transition metal content of the upper layer (front-surface antireflection layer) is high, there occurs a phenomenon that the surface is clouded white (becomes cloudy). This is considered to be because MoO is precipitated on the surface. In order to also suppress such a phenomenon, the transition metal content of the upper layer is preferably 10 at % or less.

Figure 3:
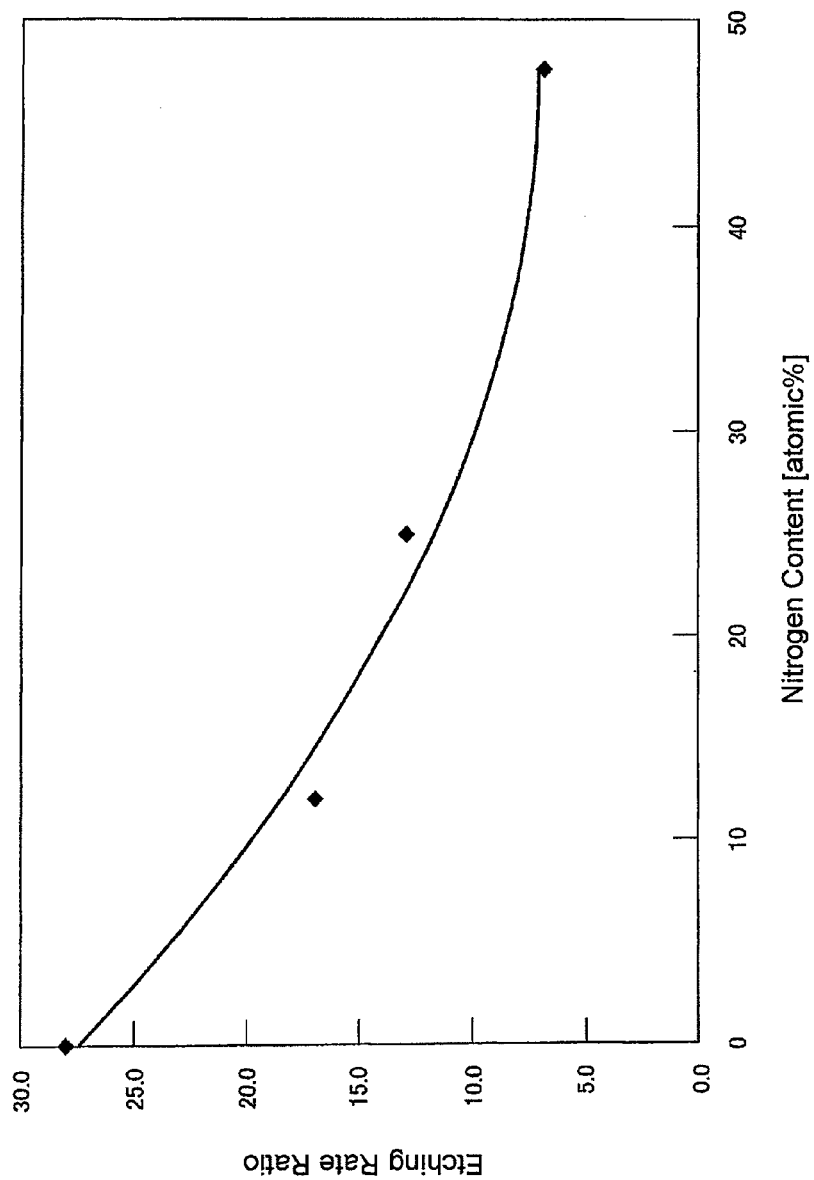
FIG. 3 is a diagram showing the relationship between the etching rate ratio of a lower layer to an upper layer in EB defect correction and the nitrogen content of the lower layer.

On the other hand, the etching rate in the EB defect correction tends to be lowered as the content of oxygen or nitrogen in the layer increases. Further, as described above, the ratio of the etching rate of the lower layer to that of the upper layer should be set to 20.0 or less. FIG. 3 is a diagram showing the relationship between the etching rate ratio of a lower layer to an upper layer in EB defect correction and the nitrogen content of the lower layer. The upper layer is a film having a composition ratio of a transition metal, silicon, oxygen, and nitrogen that satisfies a condition for a required front-surface antireflection function, while the lower layer is a film containing a transition metal (molybdenum), silicon, and nitrogen. According to this, it is seen that, in order to set the etching rate ratio in the EB defect correction to 20.0 or less, the nitrogen content of the lower layer should be set to 10 at % or more.

Molybdenum is used herein as the transition metal of the lower layer, but not limited thereto, i.e. the same tendency is shown for other transition metals. In the upper layer with the required front-surface antireflection function used herein, the total content of oxygen and nitrogen is 40.3 at % (30 at % or more) and the content of the transition metal (molybdenum) is 3 at % (10 at % or less). Since the etching rate in the EB defect correction tends to be lowered as the oxygen or nitrogen content increases, this upper layer is a film whose etching rate is lower than that of the film in which the content of oxygen and nitrogen is 30 at %. As shown in FIG. 3, the degree of reduction in the etching rate is very small when the content in the film, although it is nitrogen, is 40 at % or more and, therefore, it can be expected that approximately the same tendency is shown even in the case of the upper layer in which the content of oxygen and nitrogen is 40 at % or more.

Figure 4:
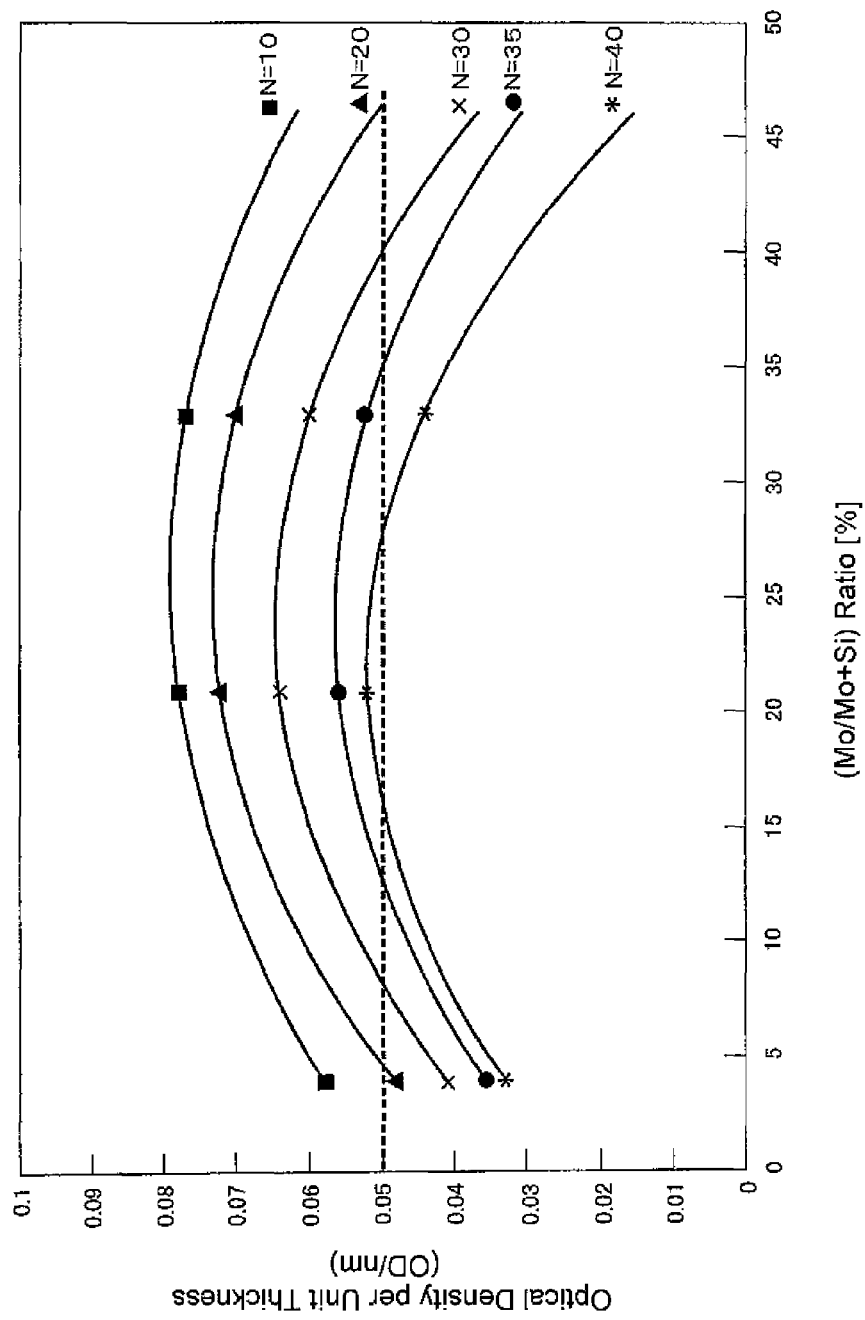
FIG. 4 is a diagram showing the relationship between the ratio, obtained by dividing the molybdenum content by the molybdenum and silicon total content in a thin film containing molybdenum, silicon, and nitrogen, and the optical density per unit thickness.

In the light-shielding film, the upper layer serves as a front-surface antireflection layer and has a low optical density and thus it cannot contribute much to the optical density of the entire light-shielding film. Taking these into account, the optical density required for the light-shielding film 2 should be substantially ensured by the lower layer. FIG. 4 is a diagram showing the relationship between the ratio obtained by dividing the molybdenum content [at %] by the molybdenum and silicon total content [at %] in a thin film containing molybdenum, silicon, and nitrogen (i.e. the ratio of the molybdenum content [at %] in a light-shielding film when the molybdenum and silicon total content [at %] in the light-shielding film is given as 100; hereinafter referred to as a (Mo/Mo+Si) ratio) and the optical density per unit thickness. Characteristic curves in the figure respectively describe cases where the nitrogen content of a thin film is 10 at % (curve of "■N=10"), where the nitrogen content of a thin film is 20 at % (curve of "▲N=20"), where the nitrogen content of a thin film is 30 at % (curve of "×N=30"), where the nitrogen content of a thin film is 35 at % (curve of "●N=35"), and where the nitrogen content of a thin film is 40 at % (curve of "*N=40"). In order to ensure most of the optical density of the entire light-shielding film by the lower layer, the optical density (OD) per unit thickness of the material is preferably 0.05 $nm^{-1}$ (wavelength: 193 nm) or more. Taking this into account, the condition is satisfied only for a specific narrow range of (Mo/Mo+Si) ratios when the nitrogen content is 40 at %. For a reason described later, it is difficult to apply this to the invention of this application. On the other hand, in the case of the thin film with a nitrogen content of 35 at % or less, the condition is satisfied for a wide range of (Mo/Mo+Si) ratios. Accordingly, it is required that the upper limit of the total content of nitrogen and oxygen in the lower layer be 35 at % at most. Further, in this event, the (Mo/Mo+Si) ratio of the lower layer is required to be 35% or less. In the case of further enhancing the light-shielding performance of the lower layer, the total content of nitrogen and oxygen in the lower layer is required to be 30 at % or less. In this case, the (Mo/Mo+Si) ratio of the lower layer is required to be 40% or less. As another factor for determining the upper limit, there is also a problem that if more than 40% molybdenum is contained, the chemical resistance and the cleaning resistance are degraded.

In the case of oxygen, the degree of reduction in the extinction coefficient relative to its content in the layer is greater as compared with nitrogen and, therefore, in proportion to the oxygen content, the thickness should be more increased for satisfying the required optical density. Since the back-surface reflectance for exposure light can be reduced only with nitrogen, the oxygen content of the lower layer is preferably less than 10 at % and, more preferably, the lower layer is substantially free of oxygen (oxygen is allowed to be contained to a degree due to contamination or the like). On the other hand, when substantially free of oxygen, the nitrogen content in the layer is preferably 35 at % or less also in terms of reducing the back-surface reflectance, but if a further reduction in the thickness of the light-shielding film has priority over the reduction in the back-surface reflectance, it is preferably 30 at % or less and more preferably 20 at % or less.

On the other hand, there is a tendency that silicon containing nitrogen or oxygen has a low conductivity (a high sheet resistance value). Therefore, in a light-shielding film containing a transition metal, silicon, and nitrogen or oxygen, it is necessary to increase the transition metal content in the film in order to increase the conductivity. In the manufacture of a transfer mask from the mask blank, as shown in FIG. 2, a resist film 4 is coated on the light-shielding film 2 (on an etching mask film 3), a design pattern is exposed and transferred to the resist film 4, and then the resist film 4 is developed and cleaned, thereby forming a resist pattern 4a. In recent years, use has been made of a method which applies a resist for electron beam writing exposure to this resist film and irradiates an electron beam for writing (electron beam exposure writing), thereby exposing a design pattern.

In this electron beam writing exposure, in terms of writing position accuracy and charge-up, the thin film under the resist film 4 (in the case of the structure comprising the light-shielding film 2 and the etching mask film 3, at least one of the light-shielding film 2 and the etching mask film 3) is required to be conductive. Specifically, it is desired that the sheet resistance value of at least one of the light-shielding film 2 and the etching mask film 3 be 3 kΩ/square or less. As will be described later, in order to achieve a reduction in the thickness of the resist film 4 (e.g. 100 nm or less), it is necessary to improve the etching rate in dry etching of the etching mask film 3 with respect to a mixed gas of chlorine and oxygen and, for this, the content of a metal component (chromium) should be set to less than 50 at %, preferably 45 at % or less, and more preferably 40 at % or less. In this case, the metal content of the etching mask film is low so that the sheet resistance value becomes greater than 3 kΩ/square. The light-shielding film 2 has the at least two-layer (2' and 2") or more laminated structure comprising the upper layer (2")and the lower layer (2'). However, when the upper layer is used as the front-surface antireflection layer, the total content of oxygen and nitrogen is required to be 30 at % or more and, further, in terms of the resistance to mask cleaning, the transition metal content is required to be 10 at % or less, and therefore, it is not easy to ensure the sheet resistance value of 3 kΩ/square or less by the upper layer of the light-shielding film 2.

Figure 5:
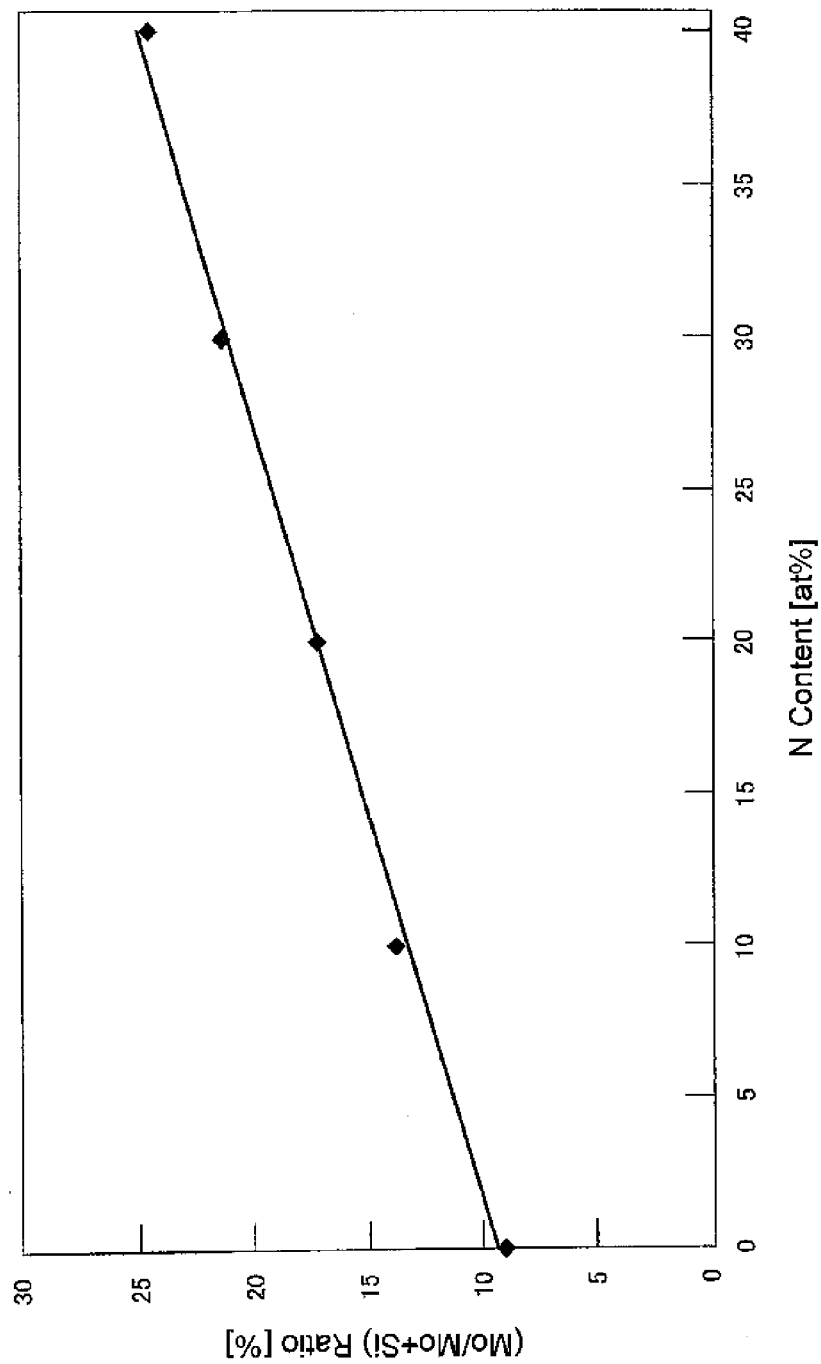
FIG. 5 is a diagram showing the relationship between the (Mo/Mo+Si) ratio satisfying a sheet resistance value of 3 k$\Omega$/square or less and the nitrogen content.

From these, it is desired that the conductivity be ensured by the lower layer of the light-shielding film 2, i.e. the sheet resistance value of the lower layer of the light-shielding film be 3 kΩ/square or less. FIG. 5 is a diagram showing the relationship between the (Mo/Mo+Si) ratio satisfying a sheet resistance value of 3 kΩ/square or less and the nitrogen content. A correlation straight line in a graph region of FIG. 5 represents a boundary such that an upper-side graph region including the correlation straight line satisfies the condition for the sheet resistance value being 3 kΩ/square or less. Since, as described above, the nitrogen content of the lower layer should be set to 10 at % or more in terms of the etching rate ratio, the (Mo/Mo+Si) ratio at which the sheet resistance value is lower than the threshold value of 3 kΩ/square is required to be 14% or more. Accordingly, the (Mo/Mo+Si) ratio in the lower layer of the light-shielding film is preferably 14% or more.

As the transition metal contained in the material of the lower layer, use can be made of molybdenum, tantalum, tungsten, titanium, chromium, hafnium, nickel, vanadium, zirconium, ruthenium, rhodium, niobium, palladium, or the like. With respect to the ratio obtained by dividing the transition metal content [at %] in the lower layer by the transition metal and silicon total content [at %] in the lower layer (i.e. the ratio of the transition metal content [at %] in a light-shielding film when the transition metal and silicon total content [at %] in the light-shielding film is given as 100; hereinafter referred to as a (M/M+Si) ratio where M is a transition metal), the description has been given of molybdenum in the above-mentioned example, but approximately the same tendency is shown for the other listed transition metals. That is, when the upper limit of the total content of nitrogen and oxygen in the lower layer is 35at % at most, the (M/M+Si) ratio of the lower layer is required to be 35% or less. In the case of further enhancing the light-shielding performance of the lower layer, the total content of nitrogen and oxygen in the lower layer is required to be 30 at % or less. In this case, the (M/M+Si) ratio of the lower layer is required to be 40% or less.

The optical density of a light-shielding film for use in a binary mask blank should be at least 2.3 or more and preferably 2.5 or more. However, in the case of a binary mask blank for producing a binary transfer mask for use in the double exposure technique or the like, if the optical density is only 2.3 or 2.5, there may arise a problem due to leakage light at overlapping exposure portions of a resist on a wafer. Taking this into account, the optical density of the light-shielding film should be at least 2.8 or more and is more preferably 3.0 or more.

On the other hand, in order to solve the problem of shadowing which arises in the DRAM hp32nm and subsequent generations according to the lithography applied with ArF exposure light of this invention, the thickness of the light-shielding film should be set to less than 65 nm and is preferably set to 60 nm or less. That is, the light-shielding film 2 should ensure the predetermined optical density with the total thickness of the upper and lower layers of less than 65 nm and, more preferably, it ensures the predetermined optical density with 60 nm or less.

Since the material with high reflectance for exposure light is used as the lower layer, the upper layer is required to have a thickness of at least 5 nm or more. Taking into account the above-mentioned shadowing problem, the thickness of the entire light-shielding film 2 is preferably less than 65 nm and, since the optical density required for the light-shielding film should be ensured mainly by the lower layer (light-shielding layer), the upper limit of the upper layer is preferably 20 nm or less. Taking into account the required low reflectivity and the desirable thickness (60 nm or less) of the entire light-shielding film, the thickness of the upper layer is more preferably 7 nm or more and 15 nm or less.

It is preferable that the lower layer (light-shielding layer) further contain at least one element of carbon or hydrogen. In the case of the light-shielding film 2 containing at least one of carbon (C) and hydrogen (H) in addition to a transition metal (molybdenum) and silicon, silicon carbide (Si—C bond) and transition metal carbide (M—C bond, e.g. Mo—C bond) and/or silicon hydride (Si—H bond), which are in a state of being not easily oxidized, are formed in the film during sputtering film formation and, therefore, it is possible to suppress oxidation of silicon and molybdenum due to irradiation of ArF exposure light and thus to expect a longer lifetime of a transfer mask.

Further, since the etching rate in patterning the light-shielding film increases due to the presence of C and/or H (silicon carbide, transition metal carbide, silicon hydride), an increase in the thickness of the resist film is prevented so that there is no degradation of resolution or pattern accuracy. Since the etching time can be shortened, in the case of the structure with the etching mask film on the light-shielding film, it is possible to reduce damage to the etching mask film so that fine patterning is enabled.

The light-shielding film of this invention is required to have the at least two-layer structure comprising the upper layer (2") and the lower layer (2'), and may have a laminated structure of three layers or more. For example, in the case of a three-layer laminated structure comprising a lowermost layer, an intermediate layer, and an uppermost layer, the upper layer of this invention may be applied to the uppermost layer and the lower layer of this invention may be applied to the intermediate layer, thereby applying the relationship between the upper layer and the lower layer of this invention to the relationship between the uppermost layer and the intermediate layer, or the upper layer of this invention may be applied to the intermediate layer and the lower layer of this invention may be applied to the lowermost layer, thereby applying the relationship between the upper layer and the lower layer of this invention to the relationship between the intermediate layer and the lowermost layer.

This invention also provides a method of manufacturing a transfer mask, comprising an etching process of patterning, by etching, the light-shielding film in the mask blank obtained by this invention and a defect correction process of correcting a black defect portion using the EB defect correction technique.

As the etching in this case, dry etching effective for forming a fine pattern is preferably used.

As shown in FIG. 1, the mask blank according to this invention may also be the mask blank 10 having the light-shielding film 2 on the transparent substrate 1 and further having the etching mask film 3 on the light-shielding film 2. In this case, the light-shielding film 2 is the light-shielding film according to the above-mentioned embodiment.

In this invention, in order to ensure etching selectivity to the light-shielding film 2 in dry etching for patterning the light-shielding film 2 to form a transfer pattern, the etching mask film 3 is preferably made of, for example, a material containing chromium and at least one of nitrogen and oxygen as a component. By providing such an etching mask film 3 on the light-shielding film 2, it is possible to achieve a reduction in the thickness of a resist film to be formed on the mask blank. The etching mask film may further contain a component such as carbon. Specifically, for example, there can be cited a material such as CrN, CrON, CrOC, or CrOCN.

The chromium content in the etching mask film is preferably less than 50 at %, more preferably 45 at % or less, and optimally 40 at % or less. The etching rate of the chromium-based material in dry etching using a mixed gas of oxygen and chlorine is improved as oxidation proceeds. Although not so much as in the case of the oxidation, the etching rate in dry etching using the mixed gas of oxygen and chlorine is also improved as nitridation proceeds. When the chromium content is 50 at % or more, the etching rate in dry etching using the mixed gas of oxygen and chlorine is largely reduced. This causes a problem that the thickness of a resist film required for dry-etching this etching mask film becomes large (e.g. greater than 100 nm) so that it is difficult to accurately transfer a fine pattern to the etching mask film.

The thickness of the etching mask film is preferably 5 nm or more and 20 nm or less. If the thickness is less than 5 nm, the film loss of the etching mask film proceeds in a pattern edge direction before completion of dry etching of the light-shielding film using an etching mask film pattern as a mask so that there is a possibility that the CD accuracy of a pattern transferred to the light-shielding film with respect to a design pattern is largely degraded. On the other hand, if the thickness is greater than 20 nm, the resist film thickness required for transferring a design pattern to the etching mask film becomes large so that it is difficult to accurately transfer a fine pattern to the etching mask film.

EXAMPLES

Hereinbelow, the embodiment of this invention will be described in further detail with reference to Examples. In addition, a Comparative Example with respect to the Examples will also be described.

Example 1

In a single-wafer sputtering apparatus, using a mixed target of molybdenum (Mo) and silicon (Si) (at % ratio Mo:Si=21:79) as a sputtering target, reactive sputtering (DC sputtering) was carried out by setting the power of a DC power supply to 2.1 kW in a mixed gas atmosphere of argon and nitrogen (gas pressure 0.07 Pa, gas flow rate ratio Ar:$N_2$=25:28), thereby forming a MoSiN film (lower layer (light-shielding layer)) to a thickness of 50 nm on a transparent substrate 1 made of synthetic quartz glass. Then, using a Mo/Si target (at % ratio Mo:Si=4:96), reactive sputtering (DC sputtering) was carried out by setting the power of a DC power supply to 3.0 kW in a mixed gas atmosphere of argon, oxygen, nitrogen, and helium (gas pressure 0.1 Pa, gas flow rate ratio Ar:$O_2$:$N_2$:He=6:3:11:17), thereby forming a MoSiON film (upper layer (front-surface antireflection layer)) to a thickness of 10 nm. In this manner, there was formed a light-shielding film 2 (total thickness 60 nm) for ArF excimer laser (wavelength 193 nm) in the form of a laminate comprising the MoSiN film (film composition ratio Mo: 14.7 at %, Si: 56.2 at %, N: 29.1 at % and the MoSiON film (film composition ratio Mo: 2.6 at %, Si: 57.1 at %, O: 15.9 at %, N: 24.4 at %). The elements of the respective layers of the light-shielding film 2 were analyzed by the Rutherford backscattering spectrometry (hereinafter the same shall apply to the Examples and the Comparative Example). The optical density (OD) of the light-shielding film 2 was 3.0 at the wavelength of ArF excimer laser exposure light.

Then, the substrate 1 with the light-shielding film 2 was heat-treated (annealed) at 450° C. for 30 minutes, thereby reducing the film stress of the light-shielding film 2.

Then, an etching mask film 3 was formed on an upper surface of the light-shielding film 2. Specifically, in a single-wafer sputtering apparatus, using a chromium (Cr) target, reactive sputtering (DC sputtering) was carried out by setting the power of a DC power supply to 1.8 kW in a mixed gas atmosphere of argon, carbon dioxide, nitrogen, and helium (gas pressure 0.2 Pa, gas flow rate ratio Ar:$CO_2$:$N_2$:He=21:37:11:31), thereby forming a CrOCN film to a thickness of 10 nm. Further, the etching mask film 3 (CrOCN film) was annealed at a temperature lower than that of the annealing of the light-shielding film 2, thereby adjusting the film stress of the etching mask film 3 to be as small as possible (preferably, substantially zero) without affecting the film stress of the light-shielding film 2. In the manner described above, a binary mask blank 10 was obtained.

Then, a binary transfer mask was manufactured using the mask blank 10 manufactured as described above. FIG. 2 shows manufacturing processes thereof.

First, a chemically amplified positive resist film 4 for electron beam writing (PRL009 manufactured by FUJIFILM Electronic Materials Co., Ltd.) was formed on the mask blank 10 (see FIG. 2, (a)).

Then, using an electron beam writing apparatus, a desired pattern was written on the resist film 4 (see the same figure, (b)) and, thereafter, the resist film 4 was developed with a predetermined developer, thereby forming a resist pattern 4a (see the same figure, (c)). In this event, in order to carry out verification of EB defect correction, a program defect portion (a portion to be a black defect) was included in advance in the pattern writing.

Then, using the resist pattern 4a as a mask, the etching mask film 3 in the form of the CrOCN film was dry-etched, thereby forming an etching mask film pattern 3a (see the same figure, (d)). A mixed gas of oxygen and chlorine (O2:Cl2=1:4) was used as a dry etching gas.

Then, the remaining resist pattern 4a was removed by ashing or the like. Then, using the etching mask film pattern 3a as a mask, the light-shielding film 2 in the form of the laminate of the MoSiN film and the MoSiON film was dry-etched, thereby forming a light-shielding film pattern 2a (2a' and 2a", see the same figure, (e)). A mixed gas of $SF_6$ and He was used as a dry etching gas. Finally, the etching mask film pattern 3a was removed using a mixed gas of oxygen and chlorine (O2:Cl2=1:4) (see the same figure, (f)).

Then, a $XeF_2$ gas as a fluorine-containing substance was supplied to a program defect portion (a black defect portion where the light-shielding film remained) of the binary transfer mask 20 and, further, an electron beam (5.0 keV) was irradiated thereto, thereby carrying out EB defect correction for removing the black defect portion by etching. Water (vapor) was supplied while etching the lower layer to properly reduce the etching rate of the lower layer. In the EB defect correction, the ratio of the etching rate of the lower layer to that of the upper layer was 10.2 and thus was in the range of 1.0 to 20.0.

As a result of the EB defect correction, the black defect was satisfactorily corrected without the occurrence of a disadvantage such as an undercut of the lower layer.

Then, the optical properties of the obtained binary transfer mask 20 were measured by a spectrophotometer SolidSpec-3700DUV (manufactured by Shimadzu Corporation). As a result, the optical density of the light-shielding film 2 for ArF exposure light was 3.0 and thus the light-shielding performance was sufficient for a binary transfer mask. Further, the front-surface reflectance and the back-surface reflectance of the light-shielding film 2 for ArF exposure light were 15.7% and 32.7%, respectively, which are the reflectances that do not affect pattern transfer.

A binary mask blank formed with no etching mask film 3 was manufactured in the same manner as described above. Then, a $XeF_2$ gas as a fluorine-containing substance was supplied to an arbitrary portion of a surface of a light-shielding film 2 and, further, an electron beam (5.0 keV) was irradiated thereto, thereby digging down the surface of the light-shielding film 2 by etching (depending on need, water (vapor) was supplied in the etching to properly reduce the etching rate). In this event, the ratio of the etching rate of a lower layer to that of an upper layer was 10.4 and thus was in the range of 1.0 to 20.0. Further, while the sheet resistance value of the etching mask film 4 was higher than 3.0 k$\Omega$, the sheet resistance value of the light-shielding film 2 was lower than 3.0 k$\Omega$ and thus the conductivity is excellent, and therefore, the writing position accuracy in the electron beam writing in the manufacture of the transfer mask was high and thus the manufactured transfer mask satisfied the position accuracy required for the DRAM hp32nm generation.

Example 2

In a single-wafer sputtering apparatus, using a mixed target of molybdenum (Mo) and silicon (Si) (at % ratio Mo:Si=21:79) as a sputtering target, reactive sputtering (DC sputtering) was carried out by setting the power of a DC power supply to 2.1 kW in a mixed gas atmosphere of argon, methane, and nitrogen (gas pressure 0.07 Pa, gas flow rate ratio $Ar+CH_4$ (8%):$N_2$=25:28), thereby forming a MoSiNCH film (lower layer (light-shielding layer)) to a thickness of 50 nm on a transparent substrate 1 made of synthetic quartz glass. Then, using a Mo/Si target (at % ratio Mo:Si=4:96), reactive sputtering (DC sputtering) was carried out by setting the power of a DC power supply to 3.0 kW in a mixed gas atmosphere of argon, oxygen, nitrogen, and helium (gas pressure 0.1 Pa, gas flow rate ratio $Ar:O_2:N_2:He$=6:3:11:17), thereby forming a MoSiON film (upper layer (front-surface antireflection layer)) to a thickness of 10 nm. In this manner, there was formed a light-shielding film 2 (total thickness 60 nm) for ArF excimer laser (wavelength 193 nm) in the form of a laminate comprising the MoSiNCH film (film composition ratio Mo: 14.5 at %, Si: 55.3 at %, N: 27.8 at %, C: 0.6 at %, H: 1.8 at %) and the MoSiON film (film composition ratio Mo: 2.6 at %, Si: 57.1 at %, O: 15.9 at %, N: 24.4 at %). The optical density (OD) of the light-shielding film 2 was 3.0 at the wavelength of ArF excimer laser exposure light.

Then, in the same manner as in Example 1, the light-shielding film 2 was annealed and then an etching mask film 3 was formed on an upper surface of the light-shielding film 2, thereby obtaining a binary mask blank 10. Further, in the same manner as in Example 1, a binary transfer mask 20 was manufactured using this mask blank 10.

Then, in the same manner as in Example 1, a $XeF_2$ gas as a fluorine-containing substance was supplied to a program defect portion (a black defect portion where the light-shielding film remained) of the binary transfer mask 20 and, further, an electron beam (5.0 keV) was irradiated thereto, thereby carrying out EB defect correction for removing the black defect portion by etching. Water (vapor) was supplied while etching the lower layer to properly reduce the etching rate of the lower layer. In the EB defect correction, the ratio of the etching rate of the lower layer to that of the upper layer was 12.2 and thus was in the range of 1.0 to 20.0.

As a result of the EB defect correction, the black defect was satisfactorily corrected without the occurrence of a disadvantage such as etching of a portion which should not primarily be corrected or an undercut of the lower layer.

Then, the optical properties of the obtained binary transfer mask 20 were measured by a spectrophotometer SolidSpec-3700DUV (manufactured by Shimadzu Corporation). As a result, the optical density of the light-shielding film 2 for ArF exposure light was 3.0 and thus the light-shielding performance was sufficient for a binary transfer mask. Further, the front-surface reflectance and the back-surface reflectance of the light-shielding film 2 for ArF exposure light were 15.5% and 32.4%, respectively, which are the reflectances that do not affect pattern transfer.

A binary mask blank formed with no etching mask film 3 was manufactured in the same manner as described above. Then, a $XeF_2$ gas as a fluorine-containing substance was supplied to an arbitrary portion of a surface of a light-shielding film 2 and, further, an electron beam (5.0 keV) was irradiated thereto, thereby digging down the surface of the light-shielding film 2 by etching (depending on need, water (vapor) was supplied in the etching to properly reduce the etching rate). In this event, the ratio of the etching rate of a lower layer to that of an upper layer was 12.4 and thus was in the range of 1.0 to 20.0. Further, while the sheet resistance value of the etching mask film 4 was higher than 3.0 k$\Omega$, the sheet resistance value of the light-shielding film 2 was lower than 3.0 k$\Omega$ and thus the conductivity is excellent, and therefore, the writing position accuracy in the electron beam writing in the manufacture of the transfer mask was high and thus the manufactured transfer mask satisfied the position accuracy required for the DRAM hp32nm generation.

Example 3

In a single-wafer sputtering apparatus, using a mixed target of molybdenum (Mo) and silicon (Si) (at % ratio Mo:Si=21:79) as a sputtering target, reactive sputtering (DC sputtering) was carried out by setting the power of a DC power supply to 2.1 kW in a mixed gas atmosphere of argon and nitrogen (gas pressure 0.07 Pa, gas flow rate ratio $Ar:N_2$=25:15), thereby forming a MoSiN film (lower layer (light-shielding layer)) to a thickness of 49 nm on a transparent substrate 1 made of synthetic quartz glass. Then, using a Mo/Si target (at % ratio Mo:Si=4:96), reactive sputtering (DC sputtering) was carried out by setting the power of a DC power supply to 3.0 kW in a mixed gas atmosphere of argon, oxygen, nitrogen, and helium (gas pressure 0.1 Pa, gas flow rate ratio $Ar:O_2:N_2:He$=6:3:11:17), thereby forming a MoSiON film (upper layer (front-surface antireflection layer)) to a thickness of 10 nm. In this manner, there was formed a light-shielding film 2 (total thickness 59 nm) for ArF excimer laser (wavelength 193 nm) in the form of a laminate comprising the MoSiN film (film composition ratio Mo: 15.7 at %, Si: 64.8 at %, N: 19.5 at %) and the MoSiON film (film composition ratio Mo: 2.6 at %, Si: 57.1 at %, O: 15.9 at %, N: 24.4 at %). The optical density (OD) of the light-shielding film 2 was 3.0 at the wavelength of ArF excimer laser exposure light.

Then, in the same manner as in Example 1, the light-shielding film 2 was annealed and then an etching mask film 3 was formed on an upper surface of the light-shielding film 2, thereby obtaining a binary mask blank 10. Further, in the same manner as in Example 1, a binary transfer mask 20 was manufactured using this mask blank 10.

Then, in the same manner as in Example 1, a XeF$_2$ gas as a fluorine-containing substance was supplied to a program defect portion (a black defect portion where the light-shielding film remained) of the binary transfer mask 20 and, further, an electron beam (5.0 keV) was irradiated thereto, thereby carrying out EB defect correction for removing the black defect portion by etching. Water (vapor) was supplied while etching the lower layer to properly reduce the etching rate of the lower layer. In the EB defect correction, the ratio of the etching rate of the lower layer to that of the upper layer was 13.3 and thus was in the range of 1.0 to 20.0.

As a result of the EB defect correction, the black defect was satisfactorily corrected without the occurrence of a disadvantage such as etching of a portion which should not primarily be corrected or an undercut of the lower layer.

Then, the optical properties of the obtained binary transfer mask 20 were measured by SolidSpec-3700DUV (manufactured by Shimadzu Corporation). As a result, the optical density of the light-shielding film 2 for ArF exposure light was 3.0 and thus the light-shielding performance was sufficient for a binary transfer mask. Further, the front-surface reflectance and the back-surface reflectance of the light-shielding film 2 for ArF exposure light were 15.2% and 31.7%, respectively, which are the reflectances that do not affect pattern transfer.

A binary mask blank formed with no etching mask film 3 was manufactured in the same manner as described above. Then, a XeF$_2$ gas as a fluorine-containing substance was supplied to an arbitrary portion of a surface of a light-shielding film 2 and, further, an electron beam (5.0 keV) was irradiated thereto, thereby digging down the surface of the light-shielding film 2 by etching (depending on need, water (vapor) was supplied in the etching to properly reduce the etching rate). In this event, the ratio of the etching rate of a lower layer to that of an upper layer was 13.5 and thus was in the range of 1.0 to 20.0. Further, while the sheet resistance value of the etching mask film 4 was higher than 3.0 kΩ, the sheet resistance value of the light-shielding film 2 was lower than 3.0 kΩ and thus the conductivity is excellent, and therefore, the writing position accuracy in the electron beam writing in the manufacture of the transfer mask was high and thus the manufactured transfer mask satisfied the position accuracy required for the DRAM hp32nm generation.

Example 4

In a single-wafer sputtering apparatus, using a mixed target of molybdenum (Mo) and silicon (Si) (at % ratio Mo:Si=33:67) as a sputtering target, reactive sputtering (DC sputtering) was carried out by setting the power of a DC power supply to 2.0 kW in a mixed gas atmosphere of argon and nitrogen (gas pressure 0.1 Pa, gas flow rate ratio Ar:N$_2$=25:30), thereby forming a MoSiN film (lower layer (light-shielding layer)) to a thickness of 48n m on a transparent substrate 1 made of quartz glass. Then, using a Mo/Si target (at % ratio Mo:Si=4:96), reactive sputtering (DC sputtering) was carried out by setting the power of a DC power supply to 3.0 kW in a mixed gas atmosphere of argon, oxygen, nitrogen, and helium (gas pressure 0.1 Pa, gas flow rate ratio Ar:O$_2$:N$_2$:He=6:3:11:17), thereby forming a MoSiON film (upper layer (front-surface antireflection layer)) to a thickness of 10 nm. In this manner, there was formed a light-shielding film 2 (total thickness 58 nm) for ArF excimer laser (wavelength 193 nm) in the form of a laminate comprising the MoSiN film (film composition ratio Mo: 22.3 at %, Si: 46.1 at %, N: 31.6 at %) and the MoSiON film (film composition ratio Mo: 2.6 at %, Si: 57.1 at %, O: 15.9 at %, N: 24.4 at %). The optical density (OD) of the light-shielding film 2 was 3.0 at the wavelength of ArF excimer laser exposure light.

Then, in the same manner as in Example 1, the light-shielding film 2 was annealed and then an etching mask film 3 was formed on an upper surface of the light-shielding film 2 while the thickness of the etching mask film 3 was changed to 15 nm, thereby obtaining a binary mask blank 10. Further, in the same manner as in Example 1, a binary transfer mask 20 was manufactured using this mask blank 10.

Then, in the same manner as in Example 1, a XeF$_2$ gas as a fluorine-containing substance was supplied to a program defect portion (a black defect portion where the light-shielding film remained) of the binary transfer mask 20 and, further, an electron beam (5.0 keV) was irradiated thereto, thereby carrying out EB defect correction for removing the black defect portion by etching. Water (vapor) was supplied while etching the lower layer to properly reduce the etching rate of the lower layer. In the EB defect correction, the ratio of the etching rate of the lower layer to that of the upper layer was 8.1 and thus was in the range of 1.0 to 20.0.

As a result of the EB defect correction, the black defect was satisfactorily corrected without the occurrence of a disadvantage such as etching of a portion which should not primarily be corrected or an undercut of the lower layer.

Then, the optical properties of the obtained binary transfer mask 20 were measured by SolidSpec-3700DUV (manufactured by Shimadzu Corporation). As a result, the optical density of the light-shielding film 2 for ArF exposure light was 3.0 and thus the light-shielding performance was sufficient for a binary transfer mask. Further, the front-surface reflectance and the back-surface reflectance of the light-shielding film 2 for ArF exposure light were 16.3% and 34.5%, respectively, which are the reflectances that do not affect pattern transfer.

A binary mask blank formed with no etching mask film 3 was manufactured in the same manner as described above. Then, a XeF$_2$ gas as a fluorine-containing substance was supplied to an arbitrary portion of a surface of a light-shielding film 2 and, further, an electron beam (5.0 keV) was irradiated thereto, thereby digging down the surface of the light-shielding film 2 by etching (depending on need, water (vapor) was supplied in the etching to properly reduce the etching rate). In this event, the ratio of the etching rate of a lower layer to that of an upper layer was 8.3 and thus was in the range of 1.0 to 20.0.Further, while the sheet resistance value of the etching mask film 4 was higher than 3.0 kΩ, the sheet resistance value of the light-shielding film 2 was lower than 3.0 kΩ and thus the conductivity is excellent, and therefore, the writing position accuracy in the electron beam writing in the manufacture of the transfer mask was high and thus the manufactured transfer mask satisfied the position accuracy required for the DRAM hp32nm generation.

Example 5

In a single-wafer sputtering apparatus, using a mixed target of molybdenum (Mo) and silicon (Si) (at % ratio Mo:Si=33:67) as a sputtering target, reactive sputtering (DC sputtering) was carried out by setting the power of a DC power supply to 2.0 kW in a mixed gas atmosphere of argon, methane, and nitrogen (gas pressure 0.1 Pa, gas flow rate ratio Ar+CH$_4$ (8%):$N_2$=25:30), thereby forming a MoSiNCH film (lower layer (light-shielding layer)) to a thickness of 48 nm on a transparent substrate 1 made of quartz glass. Then, using a Mo/Si target (at % ratio Mo:Si=4:96), reactive sputtering (DC sputtering) was carried out by setting the power of a DC power supply to 3.0 kW in a mixed gas atmosphere of argon, oxygen, nitrogen, and helium (gas pressure 0.1 Pa, gas flow rate ratio Ar:$O_2$:$N_2$:He=6:3:11:17), thereby forming a MoSiON film (upper layer (front-surface antireflection layer)) to a thickness of 10 nm. In this manner, there was formed a light-shielding film 2 (total thickness 58 nm) for ArF excimer laser (wavelength 193 nm) in the form of a laminate comprising the MoSiNCH film (film composition ratio Mo: 21.0 at %, Si: 43.5 at %, N: 31.6 at %, C: 0.4 at %, H: 3.5 at %) and the MoSiON film (film composition ratio Mo: 2.6 at %, Si: 57.1 at %, O: 15.9 at %, N: 24.4 at %). The optical density (OD) of the light-shielding film 2 was 3.0 at the wavelength of ArF excimer laser exposure light.

Then, in the same manner as in Example 4, the light-shielding film 2 was annealed and then an etching mask film 3 was formed on an upper surface of the light-shielding film 2, thereby obtaining a binary mask blank 10. Further, in the same manner as in Example 1, a binary transfer mask 20 was manufactured using this mask blank 10.

Then, in the same manner as in Example 1, a $XeF_2$ gas as a fluorine-containing substance was supplied to a program defect portion (a black defect portion where the light-shielding film remained) of the binary transfer mask 20 and, further, an electron beam (5.0 keV) was irradiated thereto, thereby carrying out EB defect correction for removing the black defect portion by etching. Water (vapor) was supplied while etching the lower layer to properly reduce the etching rate of the lower layer. In the EB defect correction, the ratio of the etching rate of the lower layer to that of the upper layer was 9.2 and thus was in the range of 1.0 to 20.0.

As a result of the EB defect correction, the black defect was satisfactorily corrected without the occurrence of a disadvantage such as etching of a portion which should not primarily be corrected or an undercut of the lower layer.

Then, the optical properties of the obtained binary transfer mask 20 were measured by a spectrophotometer SolidSpec-3700DUV (manufactured by Shimadzu Corporation). As a result, the optical density of the light-shielding film 2 for ArF exposure light was 3.0 and thus the light-shielding performance was sufficient for a binary transfer mask. Further, the front-surface reflectance and the back-surface reflectance of the light-shielding film 2 for ArF exposure light were 16.1% and 30.4%, respectively, which are the reflectances that do not affect pattern transfer.

A binary mask blank formed with no etching mask film 3 was manufactured in the same manner as described above. Then, a $XeF_2$ gas as a fluorine-containing substance was supplied to an arbitrary portion of a surface of a light-shielding film 2 and, further, an electron beam (5.0 keV) was irradiated thereto, thereby digging down the surface of the light-shielding film 2 by etching (depending on need, water (vapor) was supplied in the etching to properly reduce the etching rate). In this event, the ratio of the etching rate of a lower layer to that of an upper layer was 9.4 and thus was in the range of 1.0 to 20.0. Further, while the sheet resistance value of the etching mask film 4 was higher than 3.0 kΩ, the sheet resistance value of the light-shielding film 2 was lower than 3.0 kΩ and thus the conductivity is excellent, and therefore, the writing position accuracy in the electron beam writing in the manufacture of the transfer mask was high and thus the manufactured transfer mask satisfied the position accuracy required for the DRAM hp32nm generation.

Example 6

In a single-wafer sputtering apparatus, using a mixed target of molybdenum (Mo) and silicon (Si) (at % ratio Mo:Si=21:79) as a sputtering target, reactive sputtering (DC sputtering) was carried out by setting the power of a DC power supply to 2.1 kW in a mixed gas atmosphere of argon and nitrogen (gas pressure 0.07 Pa, gas flow rate ratio Ar:$N_2$=25:28), thereby forming a MoSiN film (lower layer (light-shielding layer)) to a thickness of 51 nm on a transparent substrate 1 made of synthetic quartz glass. Then, using a Mo/Si target (at % ratio Mo:Si=4:96), reactive sputtering (DC sputtering) was carried out in a mixed gas atmosphere of argon, oxygen, and nitrogen (gas pressure 0.1 Pa, gas flow rate ratio Ar:$O_2$:$N_2$=17:5:41), thereby forming a MoSiON film (upper layer (front-surface antireflection layer)) to a thickness of 10 nm. In this manner, there was formed a light-shielding film 2 (total thickness 61 nm) for ArF excimer laser (wavelength 193 nm) in the form of a laminate comprising the MoSiN film (film composition ratio Mo: 14.7 at %, Si: 56.2 at %, N: 29.1 at %) and the MoSiON film (film composition ratio Mo: 2.4 at %, Si: 56.6 at %, O: 8.1 at %, N: 32.9 at %). The optical density (OD) of the light-shielding film 2 was 3.0 at the wavelength of ArF excimer laser exposure light.

Then, in the same manner as in Example 4, the light-shielding film 2 was annealed and then an etching mask film 3 was formed on an upper surface of the light-shielding film 2, thereby obtaining a binary mask blank 10. Further, in the same manner as in Example 1, a binary transfer mask 20 was manufactured using this mask blank 10.

Then, in the same manner as in Example 1, a $XeF_2$ gas as a fluorine-containing substance was supplied to a program defect portion (a black defect portion where the light-shielding film remained) of the binary transfer mask 20 and, further, an electron beam (5.0 keV) was irradiated thereto, thereby carrying out EB defect correction for removing the black defect portion by etching. Water (vapor) was supplied while etching the lower layer to properly reduce the etching rate of the lower layer. In the EB defect correction, the ratio of the etching rate of the lower layer to that of the upper layer was 7.8 and thus was in the range of 1.0 to 20.0.

As a result of the EB defect correction, the black defect was satisfactorily corrected without the occurrence of a disadvantage such as etching of a portion which should not primarily be corrected or an undercut of the lower layer.

Then, the optical properties of the obtained binary transfer mask 20 were measured by a spectrophotometer SolidSpec-3700DUV (manufactured by Shimadzu Corporation). As a result, the optical density of the light-shielding film 2 for ArF exposure light was 3.0 and thus the light-shielding performance was sufficient for a binary transfer mask. Further, the front-surface reflectance and the back-surface reflectance of the light-shielding film 2 for ArF exposure light were 23.7% and 29.1%, respectively, which are the reflectances that do not affect pattern transfer.

A binary mask blank formed with no etching mask film 3 was manufactured in the same manner as described above. Then, a $XeF_2$ gas as a fluorine-containing substance was supplied to an arbitrary portion of a surface of a light-shielding film 2 and, further, an electron beam (5.0 keV) was irradiated thereto, thereby digging down the surface of the light-shielding film 2 by etching (depending on need, water (vapor) was supplied in the etching to properly reduce the etching rate). In this event, the ratio of the etching rate of a lower layer to that of an upper layer was 7.7 and thus was in the range of 1.0 to 20.0. Further, while the sheet resistance value of the etching mask film 4 was higher than 3.0 kΩ, the sheet resistance value of the light-shielding film 2 was lower than 3.0 kΩ and thus the conductivity is excellent, and therefore, the writing position accuracy in the electron beam writing in the manufacture of the transfer mask was high and thus the manufactured transfer mask satisfied the position accuracy required for the DRAM hp32nm generation.

Comparative Example

In a single-wafer sputtering apparatus, using a mixed target of molybdenum (Mo) and silicon (Si) (at % ratio Mo:Si=11:89) as a sputtering target, reactive sputtering (DC sputtering) was carried out in a mixed gas atmosphere of argon and nitrogen, thereby forming a MoSiN film (lower layer (light-shielding layer)) to a thickness of 40 nm on a transparent substrate 1 made of quartz glass. Then, using a Mo/Si target (at % ratio Mo:Si=4:96), reactive sputtering (DC sputtering) was carried out in a mixed gas atmosphere of argon, oxygen, and nitrogen, thereby forming a MoSiON film (upper layer (front-surface antireflection layer)) to a thickness of 10 nm. In this manner, there was formed a light-shielding film (total thickness 50 nm) for ArF excimer laser (wavelength 193 nm) in the form of a laminate comprising the MoSiN film (film composition ratio Mo: 9.9 at %, Si: 82.3 at %, N: 7.8 at %) and the MoSiON film (film composition ratio Mo: 2.6 at %, Si: 57.1 at %, O: 15.9 at %, N: 24.4 at %). The optical density (OD) of the light-shielding film 2 was 3.0 at the wavelength of ArF excimer laser exposure light.

Then, in the same manner as in Example 1, the light-shielding film 2 was annealed and then an etching mask film 3 was formed on an upper surface of the light-shielding film 2, thereby obtaining a binary mask blank. Further, in the same manner as in Example 1, a binary transfer mask was manufactured using this mask blank.

Then, in the same manner as in Example 1, a $XeF_2$ gas as a fluorine-containing substance was supplied to a program defect portion (a black defect portion where the light-shielding film remained) of this binary transfer mask and, further, an electron beam (5.0 keV) was irradiated thereto, thereby carrying out EB defect correction for removing the black defect portion by etching. Water (vapor) was supplied while etching the lower layer to properly reduce the etching rate of the lower layer. In the EB defect correction, the ratio of the etching rate of the lower layer to that of the upper layer was 21.8 and thus was outside the range of 1.0 to 20.0.

As a result of the EB defect correction, there occurred a disadvantage such as etching of a portion which should not primarily be corrected or an undercut of the lower layer. As a consequence, it was not possible to satisfactorily correct only the black defect portion, thus causing a new defect. Further, the sheet resistance value of the light-shielding film 2 was higher than 3.0 kΩ and further the sheet resistance value of the etching mask film 4 was also higher than 3.0 kΩ, and therefore, the conductivity is low. Thus, the writing position accuracy in the electron beam writing in the manufacture of the transfer mask was low and therefore the manufactured transfer mask did not satisfy the position accuracy required for the DRAM hp32nm generation.

DESCRIPTION OF SYMBOLS 1 transparent substrate
2 light-shielding film
3 etching mask film
4 resist film
10 mask blank
20 transfer mask

The invention claimed is:
1. A mask blank adapted to manufacture a transfer mask to be applied with ArF excimer laser exposure light, comprising:
a transparent substrate; and
a light-shielding film formed on the transparent substrate, the light-shielding film serving to form a transfer pattern;
wherein the light-shielding film has an at least two-layer structure comprising a lower layer composed of a first material containing a first transition metal, silicon, and one or more elements selected from oxygen and nitrogen and an upper layer composed of a second material containing a second transition metal, silicon, and one or more elements selected from oxygen and nitrogen, and
wherein a first ratio of a first etching rate of the lower layer to a second etching rate of the upper layer is 1.0 to 20.0 in etching which is carried out by supplying a fluorine-based gas in a unexcited state to a target portion and irradiating charged particles onto the target portion.
2. The mask blank according to claim 1, wherein a total content of the nitrogen and the oxygen is 10 at % or more in the lower layer.
3. The mask blank according to claim 1, wherein a total content of the nitrogen and the oxygen is 30 at % or more in the upper layer.
4. The mask blank according to claim 1, wherein a content of the second transition metal is 10 at % or less in the upper layer.
5. The mask blank according to claim 1, wherein a total content of the nitrogen and the oxygen is 35 at % in the lower layer.
6. The mask blank according to claim 5, wherein a second ratio obtained by dividing a first content of the first transition metal in the lower layer by a total second content of the first transition metal and the silicon is 14% or more and 35% or less in the lower layer.
7. The mask blank according to claim 1, wherein a total content of the nitrogen and the oxygen is 30 at % or less in the lower layer.
8. The mask blank according to claim 7, wherein a second ratio obtained by dividing a first content of the first transition metal in the lower layer by a total second content of the first transition metal and the silicon is 14% to 40% in the lower layer.
9. The mask blank according to claim 1, wherein the light-shielding film has a thickness of less than 65 nm.
10. The mask blank according to claim 1, wherein the upper layer has a thickness of 5 nm to 20 nm.
11. The mask blank according to claim 1, wherein an etching mask film is provided on an upper surface of the light-shielding film,
wherein the etching mask film contains chromium and at least one of nitrogen and oxygen, a content of the chromium is less than 50 at % in the etching mask film, and a thickness of the etching mask film is 5 nm to 20 nm.
12. A transfer mask manufactured using the mask blank according to claim 1.
13. A method of manufacturing a transfer mask by using the mask blank according to claim 1, comprising:
a defect correction step of making a comparison between a design transfer pattern and a transfer pattern formed in the light-shielding film and etching a defect portion, where the light-shielding film remains, by supplying a fluorine based gas in an unexcited state to the defect portion and irradiating charged particles to the defect portion, wherein the defect correction step supplies water or an oxide-based fluid upon etching the lower layer of the light-shielding film so as to reduce the first etching rate of the lower layer.

14. The mask blank according to claim 1, wherein the lower layer is composed of a third material containing a third transition metal, silicon, hydrogen, and one or more elements selected from oxygen and nitrogen.

* * * * *